US010042682B2

(12) United States Patent
Estep

(10) Patent No.: US 10,042,682 B2
(45) Date of Patent: Aug. 7, 2018

(54) COPY MESSAGE FROM APPLICATION BUFFER TO SEND BUFFER WITHIN KERNEL

(71) Applicant: Hewlett Packard Enterprise Development LP, Houston, TX (US)

(72) Inventor: Patrick Estep, Plano, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/113,129

(22) PCT Filed: Jan. 30, 2014

(86) PCT No.: PCT/US2014/013727
§ 371 (c)(1),
(2) Date: Jul. 21, 2016

(87) PCT Pub. No.: WO2015/116075
PCT Pub. Date: Aug. 6, 2015

(65) Prior Publication Data
US 2017/0004028 A1    Jan. 5, 2017

(51) Int. Cl.
*G06F 3/00*    (2006.01)
*G06F 9/54*    (2006.01)
*G06F 17/50*    (2006.01)

(52) U.S. Cl.
CPC .............. *G06F 9/546* (2013.01); *G06F 9/54* (2013.01); *G06F 9/544* (2013.01); *G06F 17/50* (2013.01)

(58) Field of Classification Search
CPC ................................ G06F 9/541; G06F 17/50
USPC ......................................................... 719/319
See application file for complete search history.

(56) References Cited

U.S. PATENT DOCUMENTS

| 5,507,005 A * | 4/1996 | Kojima | G06F 3/0601 710/52 |
|---|---|---|---|
| 6,473,803 B1 | 10/2002 | Stern et al. | |
| 6,850,990 B1 * | 2/2005 | Howarth | G06F 9/544 709/246 |
| 7,721,299 B2 * | 5/2010 | van Riel | G06F 9/5077 709/212 |
| 7,809,774 B2 | 10/2010 | Tichy et al. | |
| 2003/0231659 A1 * | 12/2003 | DiMambro | H04L 29/06 370/473 |

(Continued)

FOREIGN PATENT DOCUMENTS

| JP | 2005285042 | 10/2005 |
|---|---|---|
| KR | 1020130107276 | 10/2013 |

OTHER PUBLICATIONS

David, The Distributed V Kernel and its Performance for Diskless Workstations, 1983.*

(Continued)

*Primary Examiner* — Lechi Truong
(74) *Attorney, Agent, or Firm* — Hewlett Packard Enterprise Patent Department

(57) ABSTRACT

A send buffer is allocated within a kernel of an operating system (OS) of a first node. An application of the first node includes an application buffer. A message of an application buffer is copied to the send buffer. The kernel of the first node is to aggregate a plurality of the messages stored at the send buffer into a single transfer and to output the single transfer across a network to a second node.

13 Claims, 3 Drawing Sheets

(56) References Cited

U.S. PATENT DOCUMENTS

| | | | | |
|---|---|---|---|---|
| 2007/0011687 | A1* | 1/2007 | Ilik | G06F 9/546 |
| | | | | 719/313 |
| 2008/0013448 | A1* | 1/2008 | Horie | G06F 13/105 |
| | | | | 370/229 |
| 2009/0225771 | A1* | 9/2009 | Yasuda | H04L 49/90 |
| | | | | 370/412 |
| 2012/0036200 | A1 | 2/2012 | Cole et al. | |
| 2012/0158930 | A1 | 6/2012 | Kalusivalingam et al. | |
| 2012/0185930 | A1 | 7/2012 | Desai et al. | |
| 2013/0117036 | A1 | 5/2013 | Cothren et al. | |

OTHER PUBLICATIONS

"Highly Efficient Network Processing on Dedicated Cores Computer Science Essay", < http://www.ukessays.com/essays/computer-science/highiy-efficient-network-processing-on-dedicated-cores-computer-science-essay.php >, 2003, 2 pages.

Chetlur, et al.; "Optimizing Communication in Time-warp Simulators", < http://citeseerx.ist.psu.edu/viewdoc/download?doi=10.1.1.27.6428&rep=rep1&type=pdf >, Nov. 4, 2007, 9 pages.

Gupta; "Adaptive Message Clustering for Distributed Agent Based Systems", < https://getd.libs.uga.edu/pdfs/gupta_abhishek_201012_ms.pdf >, Nov. 15, 2010, 47 pages.

International Searching Authority, "Notfication of the International Search Report and the Written Opinion", PCT/US2014/013727, dated Aug. 29, 2014, 9 pages.

Iskra, et al.; "Towards Grid-aware Timewarp", < http://ieeexplore.ieee.org/xpl/articleDetails.jsp?tp=&arnumber=1301286&queryText%3D.QT.message+aggregation.QT.+Kernel > on pp. 63-70, May 16-19, 2004.

Nieplocha, et al.; "Optimizing Mechanisms for Latency Tolerance in Remote Memory Access Communication on Clusters", < .emsl.pnl.gov/docs/parsoft/armci/pubiications/hknbrma.pdf >, Sep. 19, 2003, 10 pages.

Vilayanmir, M. etal. "Kernel-Level Caching for Optimizing I/0 by Exploiting Inter-Application Data Sharing", Proceedings of the IEEE International Conference on Cluster Computing. IEEE. 2002, 8 pages.

* cited by examiner

COPY MESSAGE FROM APPLICATION BUFFER TO SEND BUFFER WITHIN KERNEL

BACKGROUND

Networks may have various types of communication topologies. A common communications topology is one with many processes/threads per node, where every process/thread may communicate with every other process/thread in a cluster of nodes. Manufacturers, vendors, and/or service providers are challenged to provide improved communication topologies for more efficient transfer of information between nodes.

BRIEF DESCRIPTION OF THE DRAWINGS

The following detailed description references the drawings, wherein.

DETAILED DESCRIPTION

Specific details are given in the following description to provide a thorough understanding of embodiments. However, it will be understood that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Common communications topologies may have many processes/threads per node that can communicate with other processes/threads in a cluster of nodes. These topologies may suffer in performance and scalability. For instance, as a number of nodes and a number of processes/threads increases, the number of connections per node may grow exponentially, e.g. n^2 connections, where n is the number of processes/threads. As the underlying interconnect may have to multiplex/demultiplex each connection onto a single interface, this contention may cause a performance bottleneck.

Also, there is typically a limit on the number of connections that may be possible per node. As the number of nodes and the number of processes/threads increase, this limit may be reached. Many of the messages being sent in these topologies may be small, which results in poor network throughput. Current systems, which are implemented in user level code, may not fully solve the above problems.

Examples may provide a message aggregation system that uses kernel level code to achieve increased performance and scalability. An example device may include a send buffer and a copy unit. The send buffer may be allocated within a kernel of an operating system (OS) of a first node. The copy unit within the kernel of the first node may directly copy a message of an application buffer to the send buffer. The application of the first node may include the application buffer. The kernel of the first node may aggregate a plurality of the messages stored at the send buffer into a single transfer and may output the single transfer across a network to a second node.

Thus, examples may provide a message aggregation system, using kernel level code, which improves communications bandwidth. For example, kernel level code may be used to aggregate many small messages into fewer larger messages and to reduce the number of communication connections n^2 to n (where n is the total number of processes on a cluster). A number of data copies may also be reduced by using kernel level copy mechanisms. Thus, performance and scalability for message-intensive applications in large, parallel clusters may be improved.

Figure 1:
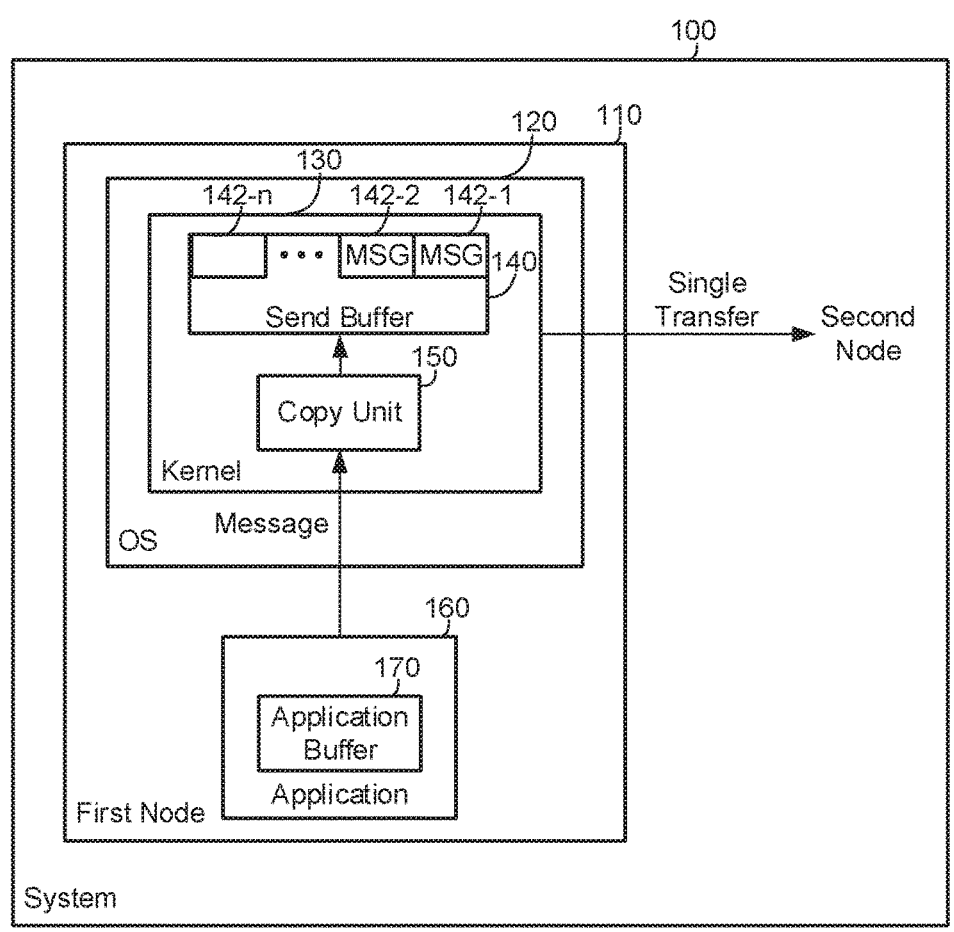
FIG. 1 is an example block diagram of a system to copy a message from an application buffer to a send buffer within a kernel.

Referring now to the drawings. FIG. 1 is an example block diagram of a system 100 to copy a message from an application buffer to a send buffer within a kernel. The system 100 may be any type of message aggregation system, such as a communication network. Example types of communication networks may include wide area networks (WAN), metropolitan area networks (MAN), local area networks (LAN), Internet area networks (IAN), campus area networks (CAN) and virtual private networks (VPN).

The system 100 is shown to include a first node 110. The term node may refer to a connection point, a redistribution point or a communication endpoint. The node may be an active electronic device that is attached to a network, and is capable of sending, receiving, or forwarding information over a communications channel. Examples of the node may include data communication equipment (DOE) such as a modem, hub, bridge or switch; or data terminal equipment (DTE) such as a digital telephone handset, a printer or a host computer, like a router, a workstation or a server.

The first node is shown include an operating system (OS) 120 and an application 160. An OS may be a collection of software that manages computer hardware resources and provides common services for applications. Examples types of OSs may include Android. BSD, iOS, Linux, OS X, QNX, Microsoft Windows, Windows Phone, and IBM z/OS.

The OS 120 is shown to include a kernel 130. The kernel 130 may be a central part of the OS 120 that loads first, and remains in main memory (not shown). Typically, the kernel 130 may be responsible for memory management, process and task management, and disk management. For example, the kernel 130 may manages input/output requests from an application and translate it into data processing instructions for a central processing unit (not shown) and other electronic components of a node. The kernel 130 may also allocate requests from applications to perform I/O to an appropriate device or part of a device.

The application 160 may be a sequence of instructions, written to perform a specified task with the node, such as tasks beyond the running of the node itself. The application 160 may apply the power of a particular computing platform or system software to a particular purpose. Example types of applications 160 may include accounting software, enterprise software, graphics software, media players, and office suites.

The kernel 130 is shown to include a send buffer 140 and a copy unit 150. The application 160 is shown to include an application buffer 170. The term buffer may refer to a region of physical memory storage used to temporarily store data while it is being moved from one place to another. The kernel 130 and application 160 may be included in any electronic, magnetic, optical, or other physical storage device that contains or stores information, such as Random Access Memory (RAM), flash memory, a solid state drive (SSD), a hard disk drive (HDD) and the like.

The copy unit 150 may include, for example, a hardware device including electronic circuitry for implementing the functionality described below, such as control logic and/or memory. In addition or as an alternative, the set and copy unit 150 may be implemented as a series of instructions encoded on a machine-readable storage medium and executable by a processor.

The send buffer 140 is allocated within the kernel 130 of the OS 120 of the first node 110. Thus, the send buffer 140 may not be paged out of the kernel 130. The copy unit 150 within the kernel 130 of the first node 110 may directly copy a message of the application buffer 170 to the send buffer 140. This message may be copied via a single copy mechanism where the message is not copied to any intermediate buffers between application buffer 170 and the send buffer 140.

The copy unit 150 may copy the message from the application buffer 170 to the send buffer 140 in response to a system call. The system call may be a request of the kernel 130 by the application 160 and may be uninterruptible. For example, the system call may be how the application 160 requests a service from OS's kernel 130 that it does not normally have permission to run, such as Input/Output (I/O) operations. System calls may provide the interface between the process or application 160 and the OS 120.

The application 160 of the OS of the first node 110 may include the application buffer 170. The message at the application buffer 170 may relate to any information that the application 160 seeks to transmit to an application at an other node. Examples of the first node 110 may include more than one application 160 and/or application buffer 170. The copy unit 150 may directly copy a plurality of messages from one or more application buffers 170 to the send buffer 140.

The kernel 130 of the first node 110 may aggregate a plurality of the messages 142-1 to 142-n, where n is a natural number, stored at the send buffer 140 into a single transfer and may output the single transfer across a network to a second node. The kernel 130 may determine a time to output the single transfer based on, for example, a timeout threshold, a number of messages within the send buffer 140, an amount of data stored at the send buffer 140 and the like.

Thus, examples may improve message throughput by combining many small messages into fewer larger messages. Further, this may be implemented at a kernel level to provide atomic operation and therefore reduce a chance of process death while a critical resource is locked. Also, a number of data or message copies is reduced by using kernel level single copy mechanisms. The first node 110 will be explained in greater detail below with respect to FIG. 2.

Figure 2:
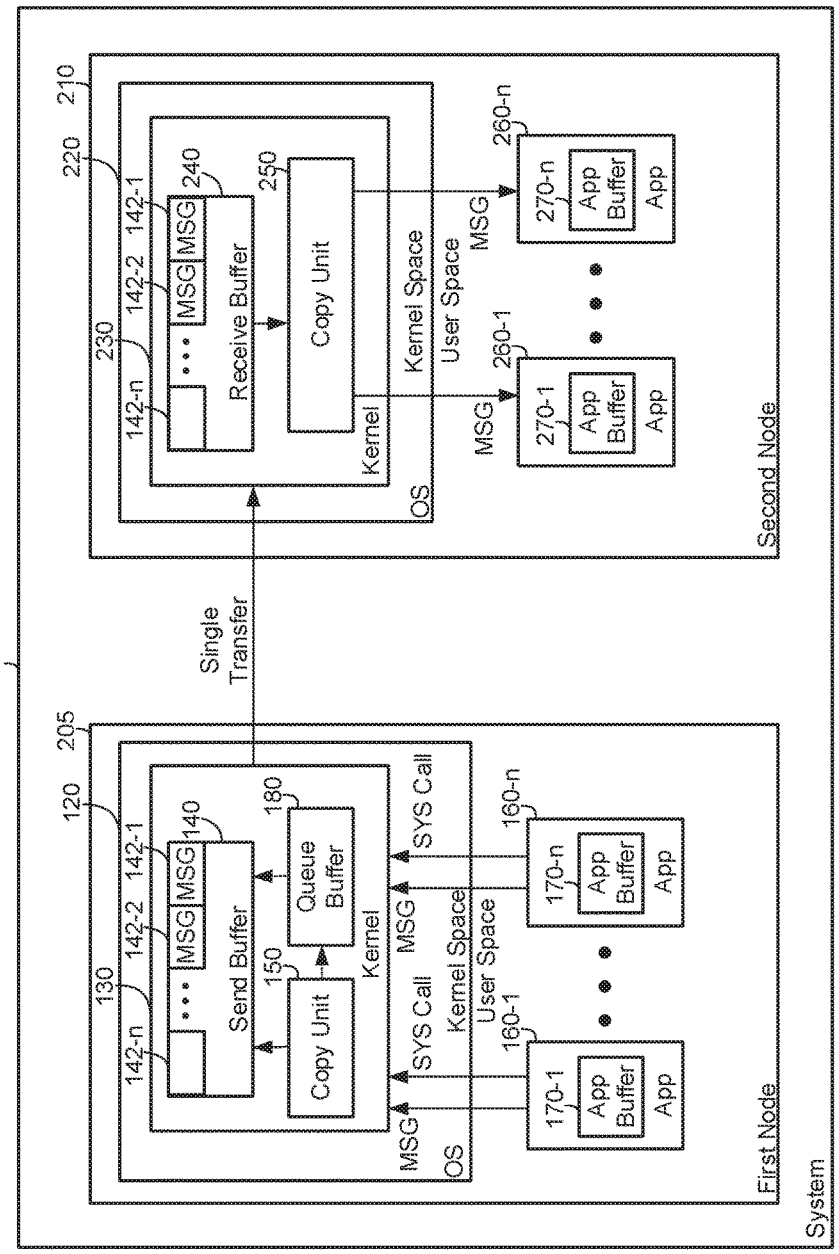
FIG. 2 is another example block diagram of a system to copy a message from an application buffer to a send buffer within a kernel.

FIG. 2 is another example block diagram of a system 200 to copy a message from an application buffer to a send buffer within a kernel. The system 200 may be any type of message aggregation system, such as a communication network, such as WAN, LAN or VPN. The system 200 is shown to include the first node 205 and a second node 210.

The first node 205 of FIG. 2 may include the functionality and/or hardware of the first node 110 of FIG. 1. For example, the first node 205 of FIG. 2 includes the OS 120 of FIG. 1, where the OS 120 includes the kernel 130. The kernel 130 includes the send buffer 140 and the copy unit 150. The kernel 130 further includes a queue buffer 180. The first node 205 also includes a plurality of the applications 160-1 to 160-n of FIG. 1 including a plurality of the application buffers 170-1 to 170-n of FIG. 1, where n is a natural number.

The second node 210 may include the functionality and/or hardware of the first node 205 of FIG. 2 and/or vice versa. For example, the second node 210 also includes a kernel 230 within an OS 220. The kernel 230 of the second node 210 further includes a copy unit 250 and a receive buffer 240, where the receive buffer 240 is at least somewhat similar to the send buffer 140. For instance, the receive buffer 240 may not be paged out of the kernel 230. The second node 210 is further shown to have a plurality of applications 260-1 to 260-n including a plurality of application buffers 270-1 to 270-n. While the system 200 is shown to only include two nodes 205 and 210, examples may include more than two nodes, such as a cluster of hundreds or thousands of nodes.

The plurality of messages 142-1 to 142-n at the first node 205 may be stored at the queue buffer 180 if the send buffer 140 is full. The kernel 130 may directly copy the queue buffer 180 to the send buffer 140 without further involvement of the application 160 after the send buffer 140 has been emptied.

The kernel 130 is located within a kernel space of the first node 110 and the applications 160-1 to 160-n are located with a user space of the first node 110. The copy unit 150 may be implemented via kernel level code to copy the messages from the user space to the kernel space. The copy unit 150 of the first node 110 may directly copy a plurality of the messages 142-1 to 142-n concurrently to the send buffer 140 from the plurality of the applications 160-1 to 160-n of the first node 110.

The receive buffer 240 is allocated within a kernel 230 of an OS 220 of the second node 210. The receive buffer 240 may receive the single transfer directly from the send buffer 140. The send and receive buffers 140 and 240 may be persistently allocated in the kernels 130 and 230 of the first and second nodes 110 and 210 for remote direct memory access (RDMA) transfers. By using a persistent RDMA approach, an preparing/unpreparing of the buffers per message transfer may be avoided.

The applications 260-1 to 260-n of the second node 210 may provide the application buffers 270-1 to 270-n to the receive buffer 240 before the single transfer is received, such as by providing an address and/or offset. The receive buffer 240 may passively receive the single transfer without involvement from the applications 260 of the second node 210. The applications 260 of the second node 210 may carry out an other operation while the send buffer 140 receives the single transfer.

The copy unit 250 within the kernel 230 of the second node 210 may directly copy at least part of the single transfer from the receive buffer 240 to at least one application buffer 270 of an application 260 of the second node 210. The copy unit 250 within the kernel 230 of the second node 210 may copy from the receive buffer 240 to the application buffer 270 of the second node 210 without involvement from the applications 260 of the second node 210. The kernel 230 of the second node 210 may notify the application 260 of the second node 210 after copying to the application buffer 270 of the second node 210 is complete.

Thus, the above kernel level examples may reduce copies compared to user level approaches, which are required to do a handshake with the receiving application and a double copy of data using shared memory. As system calls into the kernel code are uninterruptible, examples may provide an atomic mechanism for a calling application to update information, such as critical regions. This may also avoid any complicated two-phased commit protocols deployed by user level implementations. Examples may not use shared memory or intermediate processes such as user level locks.

Further, examples may allow for overlap or concurrent computation, where the applications at the receiving node may be passive or carry out other operations. Examples may reduce a number of communication connections from n^2 to n (where n is the total number of processes or applications on a cluster), by allowing applications to make only a single connection to the local kernel.

Figure 3:
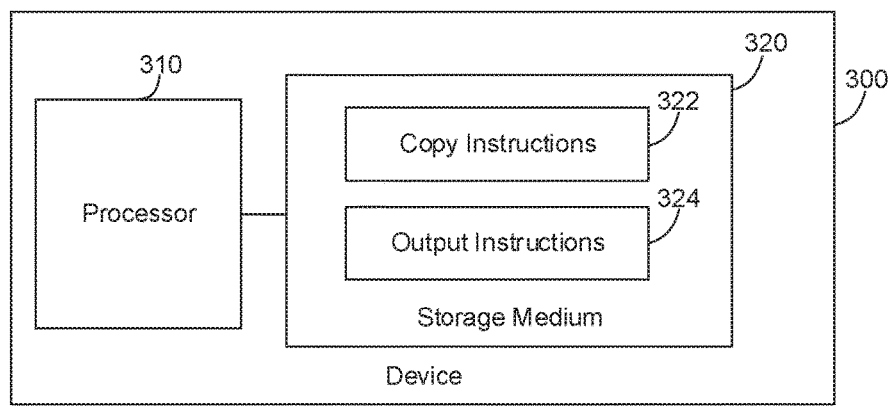
FIG. 3 is an example block diagram of a computing device including instructions for copying a message from an application buffer to a send buffer within a kernel.

FIG. 3 is an example block diagram of a computing device 300 including instructions for copying a message from an application buffer to a send buffer within a kernel. In the embodiment of FIG. 3, the computing device 300 includes a processor 310 and a machine-readable storage medium 320. The machine-readable storage medium 320 further includes instructions 322 and 324 for copying a message from an application buffer to a send buffer within a kernel.

The computing device 300 may be included in or part of, for example, a microprocessor, a controller, a memory module or device, a notebook computer, a desktop computer, an all-in-one system, a server, a network device, a wireless device, or any other type of device capable of executing the instructions 322 and 324. In certain examples, the computing device 300 may include or be connected to additional components such as memories, controllers, etc.

The processor 310 may be, at least one central processing unit (CPU), at least one semiconductor-based microprocessor, at least one graphics processing unit (GPU), a microcontroller, special purpose logic hardware controlled by microcode or other hardware devices suitable for retrieval and execution of instructions stored in the machine-readable storage medium 320, or combinations thereof. The processor 310 may fetch, decode, and execute instructions 322 and 324 to implement copying the message from the application buffer to the send buffer within the kernel. As an alternative or in addition to retrieving and executing instructions, the processor 310 may include at least one integrated circuit (IC), other control logic, other electronic circuits, or combinations thereof that include a number of electronic components for performing the functionality of instructions 322 and 324.

The machine-readable storage medium 320 may be any electronic, magnetic, optical, or other physical storage device that contains or stores executable instructions. Thus, the machine-readable storage medium 320 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 320 can be non-transitory. As described in detail below, machine-readable storage medium 320 may be encoded with a series of executable instructions for copying the message from the application buffer to the send buffer within the kernel.

Figure 4:
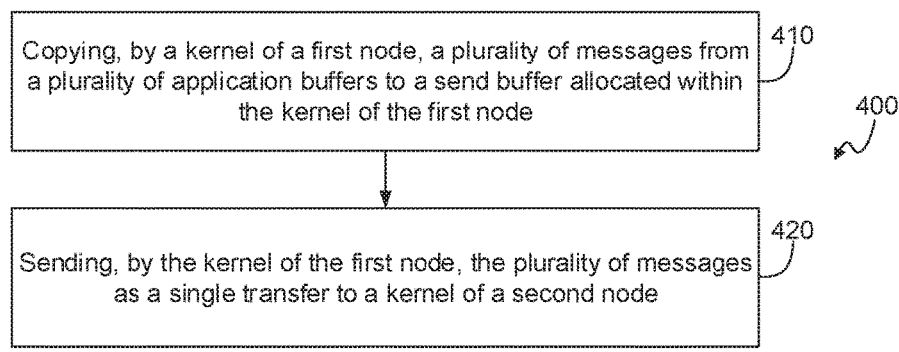
FIG. 4 is an example flowchart of a method for copying a message from an application buffer to a send buffer within a kernel.

Moreover, the instructions 322 and 324 when executed by a processor (e.g., via one processing element or multiple processing elements of the processor) can cause the processor to perform processes, such as, the process of FIG. 4. For example, the copy instructions 322 may be executed by the processor 310 to copy, via a local kernel, a message from a local application buffer to a send buffer included in the local kernel, in response to a system call from an application associated with the local application buffer.

The output instructions 324 may be executed by the processor 310 to output, via the local kernel, a plurality of the messages stored at the send buffer as a single transfer to a receive buffer included in a remote kernel. The remote kernel may directly copy at least part of the single transfer to a remote application buffer associated with a remote application.

FIG. 4 is an example flowchart of a method 400 for copying a message from an application buffer to a send buffer within a kernel. Although execution of the method 400 is described below with reference to the system 200, other suitable components for execution of the method 400 can be utilized, such as the system 100. Additionally, the components for executing the method 400 may be spread among multiple devices (e.g., a processing device in communication with input and output devices). In certain scenarios, multiple devices acting in coordination can be considered a single device to perform the method 400. The method 400 may be implemented in the form of executable instructions stored on a machine-readable storage medium, such as storage medium 320, and/or in the form of electronic circuitry.

At block 410, a kernel 130 of a first node 110 may copy a plurality of messages 142-1 to 142-n from a plurality of application buffers 170-1 to 170-n to a send buffer 140 allocated within the kernel 130 of the first node 110, in response to a plurality of system calls. The kernel 130 of the first node 110 may concurrently copy a plurality of the messages 142-1 to 142-n to the send buffer 140 in response to systems calls from a plurality of applications 160-1 to 160-n.

At block 420, the kernel 130 of the first node 110 may send the plurality of messages 142-1 to 142-n as a single transfer to a kernel 230 of a second node 210. The kernel 130 of the first node 110 may copy and/or send the plurality of messages 142-1 to 142-n, without involvement from a sending application 160 of the first node 110. The single transfer may be received by kernel 230 of the second node 210 and may be copied to at least one application buffer 270 of an application 260 of the second node 210, without involvement from the application 260 of the second node 210.

I claim:

1. A system, comprising:
   a first node; and
   a second node,
   the first node comprising:
      a hardware processor;
      a first operating system (OS);
      a send buffer allocated within a kernel of the first OS; and
      copy instructions within the kernel of the first OS and executable on the hardware processor to directly copy a plurality of messages in respective application buffers of corresponding applications to the send buffer, wherein the kernel of the first OS is to aggregate the plurality of messages from the applications stored at the send buffer into a single transfer and to output the single transfer across a network to the second node, and the kernel of the first OS is to determine a time to output the single transfer based on one or more of a timeout threshold, a number of messages within the send buffer, and an amount of data stored at the send buffer;
   the second node comprising:
      a second OS;
      a receive buffer allocated within a kernel of the second OS, the receive buffer to receive the single transfer directly from the send buffer, wherein an application of the second node is to provide an address or offset of an application buffer of the application of the second node to the receive buffer before the single transfer is received; and copy instructions within the kernel of the second OS to directly copy at least part of the single transfer from the receive buffer to the application buffer of the application of the second node, without involvement of the application of the second node, wherein the send and receive buffers are persistently allocated in the kernels of the first and second OSs for remote direct memory access (RDMA) transfers.

2. The system of claim 1, wherein
the receive buffer is to passively receive the single transfer without involvement from the application of the second node, and
the application of the second node is to carry out another operation while the receive buffer receives the single transfer.

3. The system of claim 1, wherein
the copy instructions within the kernel of the first OS are executable on the hardware processor of the first node to directly copy the plurality of the messages concurrently to the send buffer, and
the send buffer is not paged out of the kernel of the first OS.

4. The system of claim 1, wherein
the plurality of messages are to be stored at a queue buffer if the send buffer is full, and
the kernel of the first OS is to directly copy the queue buffer to the send buffer without further involvement of the applications of the first node.

5. The system of claim 1, wherein
the copy instructions within the kernel of the first OS are executable on the hardware processor of the first node to copy each message of the plurality of messages to the send buffer in response to a system call, and
the system call is uninterruptible.

6. The system of claim 1, wherein
the kernel of the first OS is located within a kernel space of the first node,
the applications are located with a user space of the first node, and
the copy instructions within the kernel of the first OS are implemented via kernel level code to copy the plurality of messages from the user space to the kernel space.

7. A method, comprising:
copying, by a kernel of a first node, a plurality of messages from a plurality of application buffers of a plurality of applications to a send buffer allocated within the kernel;
aggregating, by the kernel, the plurality of messages from the applications stored at the send buffer into a single transfer;
sending, by the kernel, the plurality of messages as the single transfer to a kernel of a second node, the sending performed without involvement of the plurality of applications of the first node, wherein the kernel of the first node determines a time to output the single transfer based on one or more of a timeout threshold, a number of messages within the send buffer, and an amount of data stored at the send buffer;
receiving, by a receive buffer allocated within the kernel of the second node, the single transfer directly from the send buffer, wherein an application of the second node provides an address or offset of an application buffer of the application of the second node to the receive buffer before the single transfer is received; and
directly copying, by the kernel of the second node, at least part of the single transfer from the receive buffer to the application buffer of the application of the second node, without involvement of the application of the second node,
wherein the send and receive buffers are persistently allocated in the kernels of the first and second nodes for remote direct memory access (RDMA) transfers.

8. The method of claim 7, wherein the copying of the plurality of messages comprises concurrently copying the plurality of messages to the send buffer in response to system calls from the plurality of applications.

9. The method of claim 7, further comprising:
copying further messages into a queue buffer of the kernel of the first node in response to the send buffer being full; and
directly copying the further messages from the queue buffer to the send buffer.

10. The method of claim 7, further comprising:
carrying out, by the application of the second node, another operation while the receive buffer receives the single transfer.

11. A non-transitory computer-readable storage medium storing instructions that, if executed cause a system to:
copy, via a kernel of a first node, a plurality of messages from a plurality of application buffers of corresponding applications to a send buffer included in the kernel, in response to system calls from the applications;
aggregate, by the kernel of the first node, the plurality of messages from the applications stored at the send buffer into a single transfer;
output, via the kernel, the plurality of messages stored at the send buffer as the single transfer over a network, wherein the kernel determines a time to output the single transfer based on one or more of a timeout threshold, a number of messages within the send buffer, and an amount of data stored at the send buffer;
receive, by a receive buffer included in a kernel of a second node, the single transfer directly from the send buffer, wherein an application of the second node is to provide an address or offset of an application buffer of the application of the second node to the receive buffer before the single transfer is received; and
directly copy, by the kernel of the second node, at least part of the single transfer from the receive buffer to the application buffer of the application of the second node, without involvement from the application of the second node,
wherein the send and receive buffers are persistently allocated in the kernels of the first and second nodes for remote direct memory access (RDMA) transfers.

12. The non-transitory computer-readable storage medium of claim 11, wherein the copying of the plurality of messages comprises copying the plurality of messages from the plurality of application buffers concurrently to the send buffer.

13. The non-transitory computer-readable storage medium of claim 11, wherein the instructions if executed cause the system to:
carry out, by the application of the second node, another operation while the receive buffer receives the single transfer.

* * * * *